United States Patent
Nagano

(10) Patent No.: US 7,046,095 B2
(45) Date of Patent: May 16, 2006

(54) REFERENCE VIBRATION GENERATOR, ITS MUTUAL SYNCHRONIZING SYSTEM, AND ITS MUTUAL SYNCHRONIZING METHOD

(75) Inventor: Seido Nagano, Tokyo (JP)

(73) Assignee: NEC Corporation, Tokyo (JP)

(*) Notice: Subject to any disclaimer, the term of this patent is extended or adjusted under 35 U.S.C. 154(b) by 30 days.

(21) Appl. No.: 10/509,631

(22) PCT Filed: Apr. 18, 2003

(86) PCT No.: PCT/JP03/04972

§ 371 (c)(1),
(2), (4) Date: Sep. 29, 2004

(87) PCT Pub. No.: WO03/103146

PCT Pub. Date: Dec. 11, 2003

(65) Prior Publication Data

US 2005/0127960 A1      Jun. 16, 2005

(30) Foreign Application Priority Data

May 17, 2002   (JP) .............................. 2002-142252

(51) Int. Cl.
  *H03L 7/24* (2006.01)
(52) U.S. Cl. .................................................. 331/55
(58) Field of Classification Search ............... 331/46, 331/55, 172

See application file for complete search history.

(56) References Cited

U.S. PATENT DOCUMENTS

| | | | |
|---|---|---|---|
| 5,546,056 A | | 8/1996 | Tokumitsu |
| 5,684,684 A | * | 11/1997 | Harris et al. ................... 363/71 |
| 5,945,882 A | | 8/1999 | Nagano |
| 6,133,798 A | | 10/2000 | Nagano et al. |

FOREIGN PATENT DOCUMENTS

| | | |
|---|---|---|
| EP | 0 665 652 A1 | 8/1995 |
| JP | 07-221546 | 8/1995 |
| JP | 10-262036 | 9/1998 |
| JP | 2000-013217 | 1/2000 |
| JP | 2000-269743 | 9/2000 |

* cited by examiner

*Primary Examiner*—David Mis
(74) *Attorney, Agent, or Firm*—Foley & Lardner LLP

(57) ABSTRACT

A reference vibration generator 1 receives transmission waves from all reference vibration generators including itself as transmission/reception waves $kk_0\Sigma P_i$ ($\Sigma$ is the sum of i=1 to N), amplifies them by an amplifier 3, superimposes them with a part of an output $P_i$ from an limit cycle vibration circuit and inputs them into the limit cycle vibration circuit to thereby perform limit cycle vibration, and transmits a part of the output $Q_j = k_0 P_j$ to the outside. With the limit cycle vibration performed cooperatively by the whole systems, transmission waves are automatically modulated, whereby mutual synchronization is realized among reference vibration generators built in or added to a plurality of system units arranged distributively.

25 Claims, 5 Drawing Sheets

$\varepsilon = 1.0, \gamma = 0.1$ $\varepsilon = 1.0, \gamma = 0.5$

REFERENCE VIBRATION GENERATOR, ITS MUTUAL SYNCHRONIZING SYSTEM, AND ITS MUTUAL SYNCHRONIZING METHOD

TECHNICAL FIELD

The present invention relates to a mutual synchronization system for reference vibration generators having vibrators for performing nonlinear limit cycle vibration and being built in or added to a plurality of system units arranged distributively, which system enables system-wide coordination and improves system-wide ability by realizing mutual synchronization among the system units.

BACKGROUND ART

Conventional methods for synchronizing reference vibration systems are summarized in the following two methods: that is, (1) preparing one reference vibration generating system and setting a distance between system units for transmitting and receiving signals to a constant value, to thereby realize synchronization between transmission and reception, and (2) detecting a phase difference between a transmission wave and a reception wave from one system unit to another, incorporating a circuit for adjusting the reference vibration, to thereby realize synchronization between transmission and reception. In a case of multiple system units, these methods are used in multistage.

In order to built a large-scale system with a large number of small-scale, low-priced systems and to make its ability exhibited at most, it is indispensable to realize synchronization between the small-scale systems so as to enable joint operation.

However, technical difficulties for solving delays increase rapidly with an increase in the number of system units in the aforementioned methods of synchronization due to their configuration.

Techniques for solving such problems are disclosed in the Japanese Paten Application Laid-open No. 10-262036 and the Japanese Patent Application Laid-open No. 2000-13217.

The technique disclosed in the Japanese Patent Application Laid-open No. 10-262036 has such a configuration that, by using a synthetic wave consisting of a received wave from another system unit and a transmission wave transmitted by itself as an input and setting the upper limit value and the lower limit value to the amplitude of the input wave, a reference vibration generating circuit system, which applies modulation to the transmission wave used as an output so as to put the input wave within the range, is added to each system unit. With this configuration, high-speed synchronization among system units of any numbers arranged distributively can be realized.

The technique disclosed in the Japanese Patent Application No. 2000-13217 has such a configuration that synchronization is performed in a combined circuit where plural oscillation circuits are combined due to mutual induction.

However, in the case of the technique disclosed in the Japanese Patent Application Laid-open No. 10-262036, synchronization is realized only when a phase difference exists between the received wave received from another system unit and a transmission wave transmitted by itself in the initial state. This is not so configured that synchronization is performed when the basic frequencies of the respective system units or the respective oscillation circuits are different.

Further, in the case of the technique disclosed in the Japanese Patent Application Laid-open No. 2000-13217, synchronization is realized only when a phase difference exists between currents flowing respective oscillation circuits in the initial state. This is not so configured that synchronization is performed when the basic frequencies of the respective system units or the respective oscillation circuits are different.

Here, the basis frequency means a frequency that each system unit or each oscillation circuit oscillates independently when there is no coupling with other system units or oscillation circuits. Further, the oscillation circuit disclosed in the Japanese Patent Application No. 2000-13217 is limited to an oscillation circuit which is operative according to the van der Pol equation.

An object of the present invention is to provide reference vibration generators and their synchronizing method for realizing efficient synchronization among multiple system units so as to enable joint operation among system units arranged distributively, irrespective of the basic frequency of a reference vibration generator of each system unit. Another object of the present invention is to provide reference vibration generators and their synchronizing method which can be formed using not only oscillations according to the van der Pol equation but also using any limit cycle vibration.

DISCLOSURE OF THE INVENTION

In order to achieve the aforementioned object, the present invention comprises a plurality of reference vibration generators arranged distributively, each having a vibration means for performing nonlinear limit cycle vibration. The present invention is so configured as to perform mutual synchronization among plural reference vibration generators by inputting to each reference vibration generator at least a part of output waves from itself and from other reference vibration generators as an input wave.

Further, the present invention includes: an amplifier for amplifying an input outside signal, and a vibration means for performing nonlinear limit cycle vibration and transmitting a part of the output as a transmission signal to the outside. The present invention is so configured to superimpose the output signal amplified by the amplifier with the output signal from the vibration means in which the transmission signal is eliminated, and input them into the vibration means.

BEST MODE TO CARRY OUT THE INVENTION

The present invention will be described in detail below with reference to the drawings.

The present inventor has intensively studied to realize high-speed synchronization of reference vibration among multiple system units arranged distributively, and found that the conventional problem described above can be solved by adopting a nonlinear limit cycle vibration system as a reference vibration generator of a system unit. A specific example will be described below.

Figure 1:
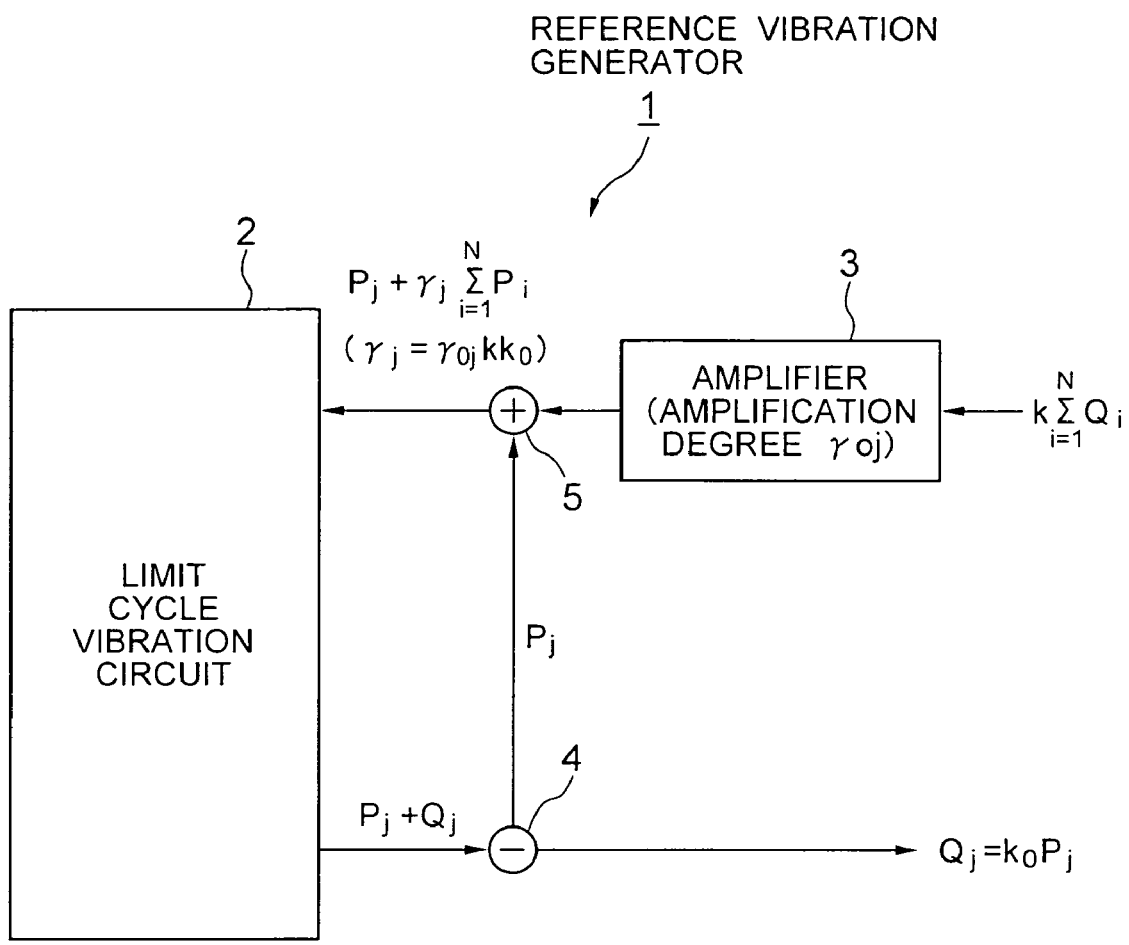
FIG. 1 is a block diagram showing the configuration of a reference vibration generator according to the present invention.

As shown in FIG. 1, a reference vibration generator 1 arranged distributively, according to the present invention, includes a limit cycle vibration circuit 2 and an amplifier 3.

There are N numbers of system units, each having the reference vibration generator 1, in the system. With the j-th system unit in this system (hereinafter referred to as system unit j), a part of an output signal $(P_j+Q_j)$ from the limit cycle vibration circuit 2 of the reference vibration generator 1 is transmitted to the outside as a transmission wave $Q_j$.

More specifically, the limit cycle vibration circuit 2 of the reference vibration generator 1 included in the system unit j performs nonlinear limit cycle vibration and outputs the output signal $P_j+Q_j$. A subtracter 4, connected to the output stage of the limit cycle vibration circuit 2, subtracts $P_j$ from the output signal $P_j+Q_j$ output through the limit cycle vibration (modulation) of the limit cycle vibration circuit 2, and transmits the transmission signal $Q_j$ to the outside as a transmission output which is a part of the output. Further, the subtracter 4 outputs the signal $P_j$, subtracted from the output signal, to an adder 5 described later.

On the other hand, to the reference vibration generator 1, the total received wave from the whole system units including itself is input.

The magnitude of the total received wave amounts to a value of $k\Sigma Q_i$ (Σ is the sum of i=1 to N) which is in proportion to the sum of the transmission waves Qi (i=positive integer of 1 to N) from respective system units. Here, k represents a proportionally constant.

The amplifier 3 has the amplification degree $\gamma_{oj}$. The amplifier 3 amplifies the total received wave $k\Sigma Q_i$ and outputs it to the limit cycle vibration circuit 2. The adder 5, connected to the previous stage of the limit cycle vibration circuit 2, adds the signal $P_j$, obtained by subtracting the transmission wave $Q_j$ from the output signal $(P_j+Q_j)$ output from the limit cycle vibration circuit 2, to the total received wave, and inputs the added synthetic wave $(P_j+\gamma_{oj}k\Sigma Q_i)$, into the limit cycle vibration circuit 2.

The limit cycle vibration circuit 2 modulates (performs nonlinear limit cycle vibration to) the input synthetic wave $(P_j+\gamma_{oj}k\Sigma Q_i)$ and outputs the output signal $(P_j+Q_j)$.

Here, if the value of the transmission wave $Q_j$ is in proportion to the output signal $P_j$ and the relationship of $Q_j=k_0P_j$ is established, the total received wave input is $kk_0\Sigma P_i$, whereby the input value of the synthetic wave input into the limit cycle vibration circuit 2 is $(P_j+\gamma_j\Sigma P_i)$. Here, $\gamma_j=\gamma_{oj}kk_0$. That is, since it comes to the input value $(P_j+\gamma_j\Sigma P_i)$ of the synthetic wave input into the limit cycle vibration circuit 2, the N numbers of system units are combined with each other.

The limit cycle vibration circuit 2 and the subtracter 4 constitute a vibration means for performing nonlinear limit cycle vibration and transmitting a part of the output as an transmission output (transmission wave $Q_j$) to the outside. The limit cycle vibration circuit 2 mainly performs a function of performing nonlinear limit cycle vibration and outputting the output signal $(P_j+Q_j)$, and the subracter 4 mainly performs a function of outputting a transmission output (transmission wave $Q_j$) as a part of the output obtained by subtracting the signal $P_j$ from the signal $(P_j+Q_j)$ output as a result of the nonlinear limit cycle vibration.

Further, the adder 5 constitutes an input means for superimposing the outside signal (total received wave $k\Sigma Q_i$) amplified by the amplifier 3 with the output signal (transmission wave $Q_j$) which is an output of the vibration means where the transmission output (transmission wave $Q_j$) is subtracted, and outputting them to the limit cycle vibration circuit 2.

Naturally, the transmission wave $Q_j$ output from the system unit j applies modulation to inputs to other system units receiving the transmission wave $Q_j$, and further applies modulation to transmission wave outputs therefrom.

The limit cycle vibration circuit 2 provided in each system unit has a nature to always restore to the stable vibration state. However, the limit cycle vibration circuit in any system unit is in the unstable vibration state where mutual modulation is repeated, unless mutual synchronization among the multiple system units are realized. The mutual modulation among the system units automatically continues until it reaches the mutual synchronized state, or the stable state.

In this way, the mutual synchronization of the reference vibration in the whole system consisting of a group of system units are realized after a certain time period. The transmission wave $Q_j$ maybe a wave capable of transmitting a signal, such as an electromagnetic wave, an acoustic wave, or an AC electric signal wave.

When the reference vibration generator 1 operates independently, the following differential equations are given, since the reference vibration generator 1 performs limit cycle vibration:

$$\frac{dP_j}{dt} = F_j(P_j, R_j) \qquad (1)$$

$$\frac{dR_j}{dt} = G_j(P_j, R_j) \qquad (2)$$

Here, $R_j$ as well as $P_j$ are variables indicating the state of the limit cycle vibration of the reference vibration generator 1. However, in a case where the limit cycle vibration is performed based on the van der Pol equation, $R_j$ represents a time differentiation or a time integration of $P_j$. $Fj(P_j,R_j)$ and $Gj(P_j,R_j)$ are functions describing the state changes of $P_j$ and $R_j$.

The operation of the system unit j in a case of the N numbers of system units being combined and operating, is represented by the following equations:

$$\frac{dP_j}{dt} = F_j(P_j, R_j) \qquad (1)$$

-continued $$\frac{dR_j}{dt} = G_j\left(P_j, \gamma_j \sum_{i=1}^{N} P_i, R_j\right) \quad (3)$$

Here, the equation (3) is a differential equation which describes the limit cycle vibration of the reference vibration generator 1, taking into account of the influences of the total received wave from all system units and the amplifier 3. The equations (1) and (3) are so set that $P_j$ and $R_j$ indicate the stable cycle changes and associatively change by time so as to form limit cycles.

Thus, the equations (1) and (3) represent mutual synchronization equations describing the mutual synchronization of all system unit systems.

The aforementioned mutual synchronization system for reference vibration generators are so configured that plural reference vibration generators shown in FIG. 1 are arranged distributively, each of which includes the amplifier 3 for amplifying an input outside signal, the vibration means (2, 4) for performing nonlinear limit cycle vibration and transmitting a part of the output as a transmission outputs, and the input means (5) for superimposing the outside signal amplified by the amplifier 3 with the output signal from the vibration means where the transmission output is subtracted, and the vibration means of each reference vibration generator 1 is provided with a function of performing mutual synchronization among the plural reference vibration generators by being input at least a part of outputs from the own reference vibration generator and from the other reference vibration generators as a received input.

As described above, mutual synchronization among the reference vibration generators is realized by performing: a first step of performing nonlinear limit cycle vibration and transmitting a part of the output as a transmission output to the outside; a second step of superimposing the amplified outside signal with the output signal generated by the limit cycle vibration where the transmission output is subtracted, and inputting the superimposed signals as an input signal of the nonlinear limit cycle vibration; and a third step of performing mutual synchronization among the plural reference vibration generators by inputting at least a part of the output from the plural reference vibration generators arranged distributively as an received input.

The aforementioned reference vibration generators, and the system and the method of mutual synchronization will be proved below using equations.

FIRST EMBODIMENT

In the present embodiment, when the system unit j operates independent from other system units, the nonlinear limit cycle vibrating operation of the limit cycle vibration circuit 2 provided in the system unit j satisfies the following van der Pol equation:

$$\frac{d^2x_j}{dt^2} - \varepsilon(1-x_j^2)\frac{dx_j}{dt} + \omega_j^2 x_j = 0 \quad (4)$$

Here, $\epsilon$ is a parameter indicating the level of the non-linearity, and $\omega_j$ represents the basic angular frequency of the limit cycle vibration circuit 2 provided in the system unit j. xj is a variable indicating the state of the nonlinear limit cycle vibration such as non-displacement, amplitude, current, voltage in the limit cycle vibration circuit 2.

The equation (4) will be further displaced as follows:

$$\frac{dx_j}{dt} = y_j \quad (5)$$

$$\frac{dy_j}{dt} = -\omega_j^2 x_j + \varepsilon(1-x_j^2)y_j \quad (6)$$

Here, by placing $(x_j, y_j) = (P_j, R_j)$ or $(x_j, y_j) = (R_j, P_j)$, the functions $F_j(P_j, R_j)$ and $G_j(P_j, R_j)$ of the equations (1) and (2) can be determined uniquely. For example, assuming $y_j = P_j$ and $x_j = R_j$. Here, $y_j = P_j$ and its integration $x_j = R_j$ are so set as to change in time corresponding to the equations (6) and (5), respectively.

Thus, the system unit system incorporating the limit cycle vibration circuit 2 is mathematically insured to be a nonlinear limit cycle vibrator.

Next, by comparing the equations (6) and (5) with the equations (1) and (2), the functions $F_j(P_j, R_j)$ and $G_j(P_j, R_j)$ can be obtained as follows by converting the variables into $x_j$ and $y_j$:

$$F_j(y_j, x_j) = -\omega_j^2 x_j + \varepsilon(1-x_j^2)y_j \quad (7)$$

$$G_j(y_j, x_j) = y_j \quad (8)$$

Thus, when the N numbers of system units are combined together and operate, the operation of the system unit j will be expressed as follows from the equations (1), (3), (7) and (8):

$$\frac{dy_j}{dt} = F_j(y_j, x_j) = -\omega_j^2 x_j + \varepsilon(1-x_j^2)y_j \quad (9)$$

$$\frac{dx_j}{dt} = G_j\left(y_j + \gamma_j \sum_{i=1}^{N} y_i, x_j\right) = y_j + \gamma_j \sum_{i=1}^{N} y_j \quad (10)$$

Next, by deforming the equations (9) and (10) to the differential format, the following equations can be obtained:

$$y_j(t+\Delta t) = -\omega_j^2 \Delta t x_j(t) + \{\varepsilon \Delta t[1-x_j(t)^2]+1\}y_j(t) \quad (11)$$

$$x_j(t+\Delta t) = x_j(t) + \Delta t\left[y_j(t) + \gamma_j \sum_{i=1}^{N} y_j(t)\right] \quad (12)$$

Here, considering to update $x_j$ and $y_j$ by a time $\Delta t$. $x_j(t)$ and $y_j(t)$ represent values of $x_j$ and $y_j$ at a time t, respectively, and $x_j(t+\Delta t)$ and $y_j(t+\Delta t)$ represent values of $x_j$ and $y_j$ updated after a time $\Delta t$ has passed. The initial values at the time t=0, that is, $x_j(0)$ and $y_j(0)$, take any numerical value.

The equation (11) means to read $y_j(t)=R_j(t)$ and its integral value $x_j(t)=Rj(t)$ at the time t, and transmit a transmission wave $ky_j(t+\Delta t)$ which is in proportion to the value given by the right-hand side after the time $\Delta t$ has passed, as a new transmission wave.

The equation (12) means to read the associated wave $[y_j(t)+\gamma_j\Sigma y_j(t)]$ and the integral value $x_j(t)$ of the $y_j(t)=P_j(t)$, and updates the integral value $x_j(t+\Delta t)$ after the time $\Delta t$ has passed to the numerical value given by the right-hand side.

The reference vibration generator 1 of the present embodiment is configured to satisfy both equations (11) and (12) simultaneously. By repeating such a process, mutual synchronization among all reference vibration generators can be realized after a certain period of time.

Simulation results in some systems will be shown below.

EXAMPLE 1

Figure 2A:
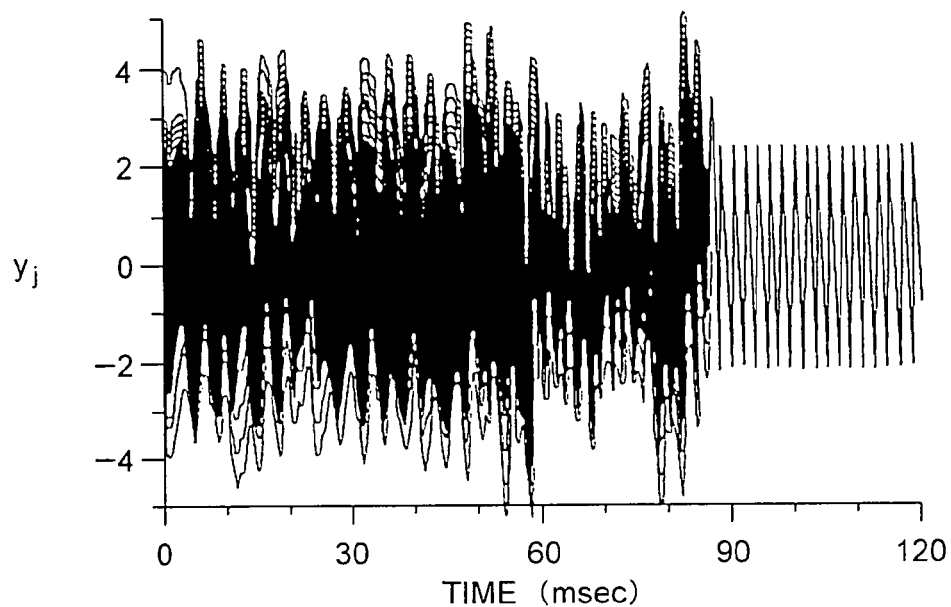
FIGS. 2A and 2B show $y_j$-time characteristics for two $\gamma$ values for explaining mutual synchronization among reference signal generators according to an example 1 of the present invention.
Figure 2B:
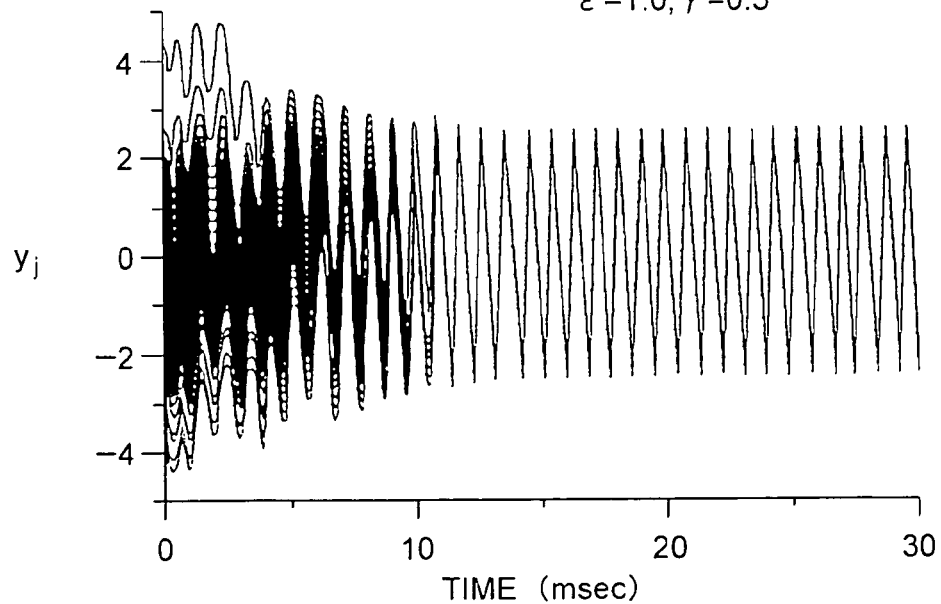
Figure 3A:
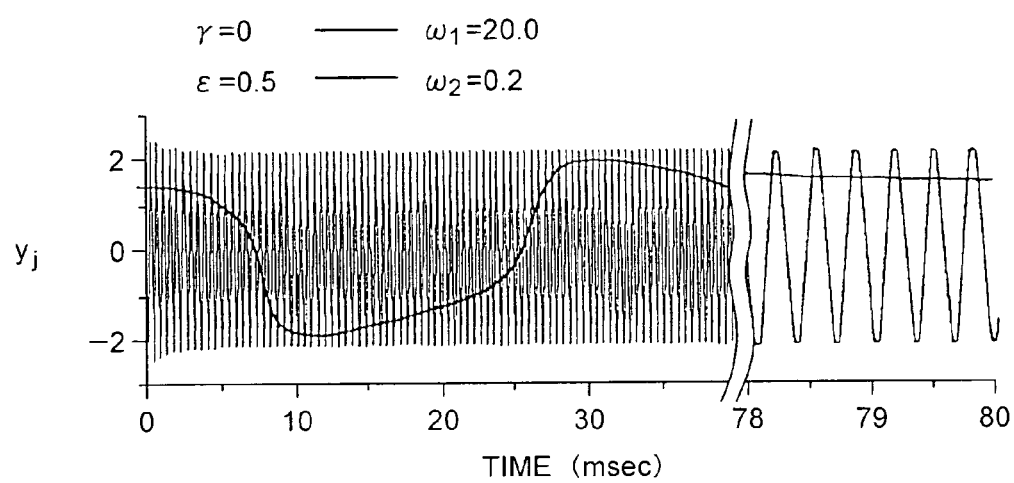
FIGS. 3A and 3B show $y_j$-time characteristics for two $\gamma$ values for explaining mutual synchronization between reference vibration generators according to an example 2 of the present invention.
Figure 3B:
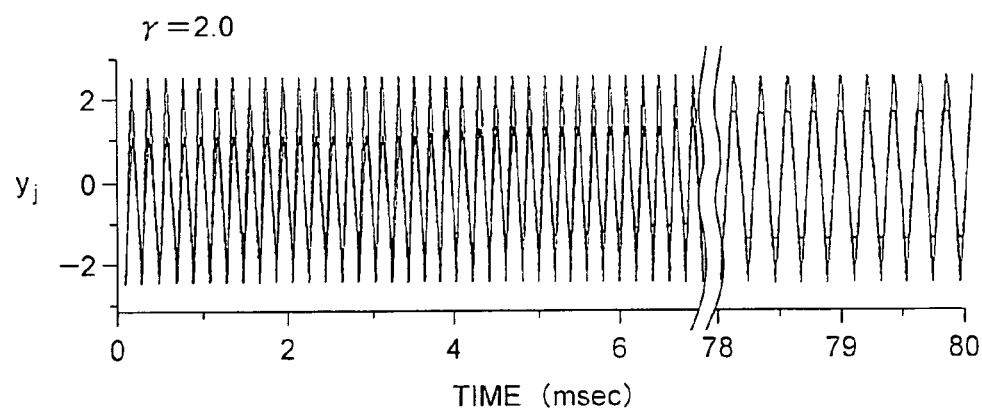

FIG. 2 shows $y_j$-time characteristic charts for two γ values for explaining mutual synchronization among reference vibration generators according to an example 1. In the present example, there are one hundred system units, each of which includes a reference vibration generator performing the van der Pol vibration. The basic frequency of the one hundred reference vibration generators has the Gaussian distribution, and the average basic frequency is 1 kHz and the standard deviation is 0.07 kHz. The values of ϵ and Δt are 1.0 and $1*10^{-3}$ sec, respectively. In FIGS. 3(a) and 3(b), γ values of all of the one hundred reference vibration generators are 0.1 and 0.5, respectively. Although mutual synchronization is realized in either case, mutual synchronization is realized at about 90 msec in the case of γ=0.1, and at about 10 msec in the case of γ=0.5. As the γ value increases, mutual synchronization is realized earlier.

EXAMPLE 2

FIG. 3 shows $y_j$-time characteristic charts for two γ values for explaining mutual synchronization between reference vibration generators according to an example 2. In the present example, there are two system units having reference vibration generators with different basic frequencies. The basic frequency of each of the two reference vibration generators is 20.0 kHz and 0.2 kHz, respectively, and the ratio is 100. The values of ϵ and Δt are 0.5 and $1*10^{-3}$ msec, respectively. FIG. 3(a) shows characteristics of a case where the γ value of both of the two reference vibration generators is γ=0, that is, a case where input of the total received wave to the amplifier is cut off, so that no mutual synchronization is realized. FIG. 3(b) shows characteristics of a case where the γ value of both of the two reference vibration generators is γ=2.0, in which mutual synchronization is realized from the initial stage.

EXAMPLE 3

Figure 4:
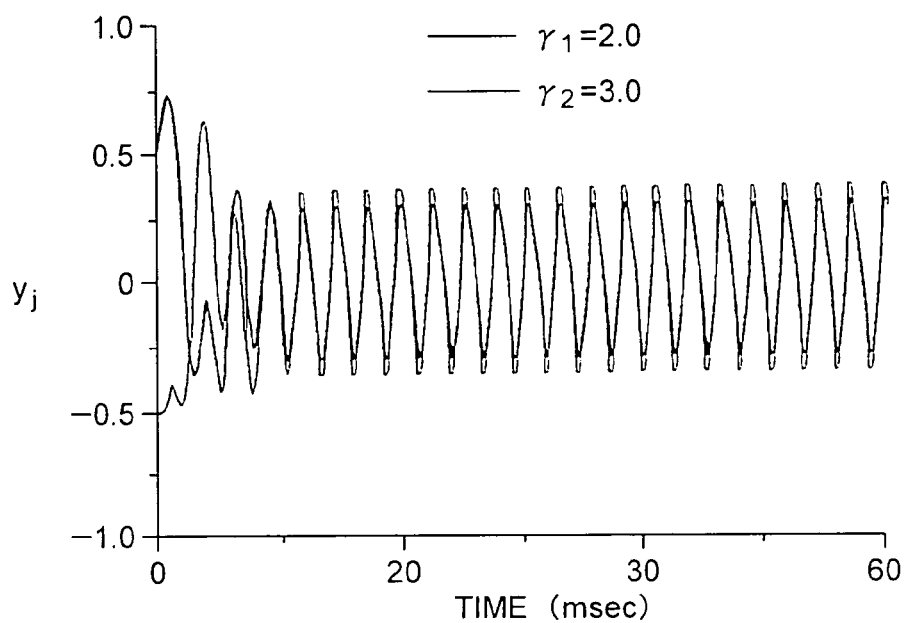
FIG. 4 shows $y_j$-time characteristics for two $\gamma$ values for explaining mutual synchronization between reference vibration generators according to an example 3 of the present invention.

FIG. 4 is a $y_j$-time characteristic chart for explaining mutual synchronization between reference vibration generators according to an example 3. In the present example, there are two system units having reference vibration generators with the same basic frequency but different γ values. The γ value of one reference vibration generator is 2.0, and the γ value of the other reference vibration generator is 3.0. The basic frequency of both generators is 1 kHz. The values of ϵ and Δt are 1.0 and $1*10^{-3}$ msec, respectively. In this case, mutual synchronization is realized starting at about 10 msec.

SECOND EMBODIMENT

In the first embodiment, the reference vibration generators of all system units perform the nonlinear limit cycle vibration described by the van der Pol equation. However, in this embodiment, the system consists of reference vibration generators performing different types of limit cycle vibration.

That is, the reference vibration generators of some of the system units perform nonlinear limit cycle vibration of the van der Pol type, and the reference vibration generators of the rest of the system units perform nonlinear limit cycle vibration satisfying the following Rayleigh equation when operating independently:

$$\frac{d^2 x_j}{dt^2} - \varepsilon \left[1 - \frac{1}{3}\left(\frac{dx_j}{dt}\right)^2\right]\frac{dx_j}{dt} + \omega_j^2 x_j = 0 \quad (13)$$

Here, ϵ represents a parameter showing the non-linearity level, and $\omega_j$ represents a basic angle frequency of the limit cycle vibration circuit 2 provided in the system unit j. As same as the first embodiment, $x_j$ is given $dx_j/dt=y_j$, when $y_j=P_j$.

In the case of the limit cycle vibration circuit 2 of the reference vibration generator performing nonlinear limit cycle vibration described by the Rayleigh equation, equations corresponding to the equations (11) and (12) in the first embodiment are given as follows using the equation (13):

$$y_j(t+\Delta t) = -\omega_j^2 \Delta t x_j(t) + \left\{\varepsilon \Delta t\left[1 - \frac{1}{3}y_j(t)^2\right] + 1\right\}y_j(t) \quad (14)$$

$$x_j(t+\Delta t) = x_j(t) + \Delta t\left[y_j(t) + \gamma \sum_{i=1}^{N} y_j(t)\right] \quad (15)$$

As same as the first embodiment, the reference vibration generators of the present embodiment are so formed as to satisfy the equations (14) and (15) simultaneously.

Figure 5:
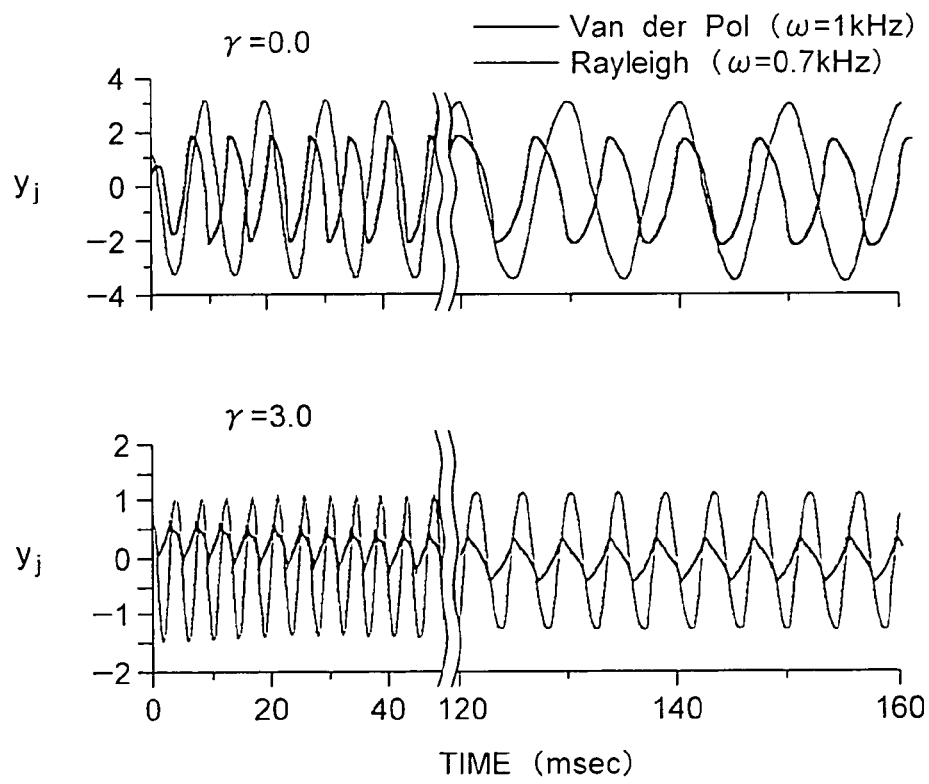
FIG. 5 shows $y_j$-time characteristics in two $\gamma$ values for explaining mutual synchronization between the reference vibration generators according to an embodiment 2 of the present invention.

FIG. 5 shows a $y_j$-time characteristic diagrams for two γ values for explaining mutual synchronization between reference vibration generators according to the present embodiment.

In FIG. 5, the bold solid line indicates $y_j$ of a reference vibration generator performing the van der Pol vibration, and a lean solid line indicates $y_j$ of a reference vibration generator performing the Rayleigh vibration. Their basic frequencies are 1 kHz and 0.7 kHz, respectively. The values of ϵ and Δt are 1.0 and $1*10^{-3}$ msec, respectively, in either reference vibration generator. FIG. 5(a) shows characteristics in a case where the γ value of both of the two reference vibration generators is γ=0, that is, a case where input of the total received wave to the amplifier is cut off, so that no mutual synchronization is realized. FIG. 5(b) shows characteristics in a case where the γ value of both of the two reference vibration generators is γ=3.0, in which mutual synchronization is realized starting at about 5 msec.

THIRD EMBODIMENT

In the present embodiment, the reference vibration generators of some of the system units perform nonlinear limit cycle described by the van der Pol equation, and the reference vibration generators of the rest of the system units perform nonlinear limit cycle vibration satisfying the following Brusselator equation when operating independently:

$$\frac{dx_j}{dt} = a - (b+1)x_j + x_j^2 y_j$$

$$\frac{dy_j}{dt} = bx_j - x_j^2 y_j$$

a and b represent constants setting the basic frequency. $Y_j$ is given by $y_j=P_j$, as same as the first and the second embodiments. Mutual synchronization among the reference vibration generators according to the present embodiment is calculated in the same manner as the second embodiment.

Figure 6:
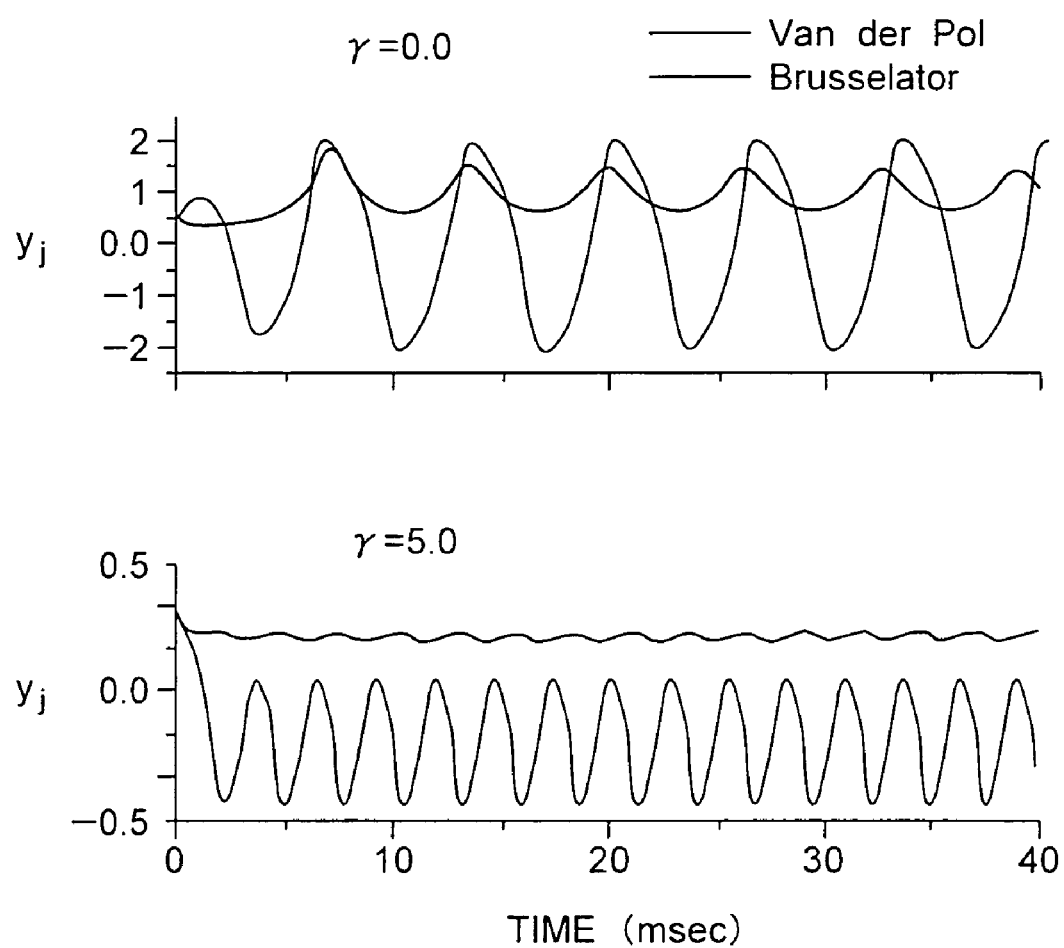
FIG. 6 shows $y_j$-time characteristics in two γ values for explaining mutual synchronization between the reference vibration generator according to an embodiment 3 of the present invention.

FIG. 6 shows $y_j$-time characteristic charts for two γ values for explaining mutual synchronization between the reference vibration generators according to the present embodiment. In FIG. 6, the lean solid line indicates $y_j$ of a reference vibration generator performing the van der Pol vibration, and the bold solid line indicates $y_j$ of a reference vibration generator performing the Brusselator vibration. The basic frequency of the reference vibration generator performing the van der Pol vibration is 1 kHz, and the evalue is 1.0. Further, a=1.0, and b=2.1. The Δt value is $1*10^{-3}$ msec in either reference vibration generator. FIG. 6(a) shows characteristics of a case where the γ value of both of the two reference vibration generator is γ=0, that is, a case where input of the total received wave to the amplifier is cut off, so that no mutual synchronization is realized. FIG. 6(b) shows characteristics of a case where the γ value of both of the two reference vibration generators is γ=5.0, in which mutual synchronization is realized starting at about 5 msec.

In the aforementioned embodiments, explanations have been given for the configuration where the basic frequencies of the limit cycle vibration in at least two reference vibration generators are different, and for the configuration where different types of nonlinear limit cycle vibration are performed as the limit cycle. However, the present invention is not limited to these embodiments. The present invention may have a configuration in which, by changing the amplification factor for amplifying or the attenuation factor for attenuating the received input, a period for realizing mutual synchronization among the plural reference vibration generators are adjusted.

INDUSTRIAL APPLICABILITY

As described above, the reference vibration generator according to the present invention takes transmission waves from other reference vibration generators into the input of a limit cycle vibration circuit while amplifying them, and transmits a part of the output to the outside. Thus, transmission wave of each reference vibration generator is automatically modulated, whereby mutual synchronization among the reference vibration generators can be realized.

What is claimed is:

1. A reference vibration generator comprising:
an amplifier for amplifying an input outside signal;
vibration means for performing nonlinear limit cycle vibration and transmitting a part of an output as a transmission output; and
input means for superimposing the outside signal amplified by the amplifier with an output signal of the vibration means in which the transmission output is subtracted, and inputting them into the vibration means.

2. The reference vibration generator, as claimed in claim 1, wherein the vibration means includes: a limit cycle vibration circuit which performs nonlinear limit cycle vibration and outputs an output signal; and an subtracter which outputs a signal obtained by subtracting a desired signal from the output signal output as a result of the nonlinear limit cycle vibration.

3. The reference vibration generator, as claimed in claim 1, wherein the input means includes an adder which superimposes the outside signal amplified by the amplifier with the output signal from the vibration means in which the transmission output is subtracted.

4. A mutual synchronization system for reference vibration generators, wherein
a plurality of reference vibration generators are arranged distributively, each of which includes: an amplifier for amplifying an input outside signal; vibration means for performing nonlinear limit cycle vibration and transmitting a part of an output as a transmission output; and input means for superimposing the outside signal amplified by the amplifier with an output signal of the vibration means in which the transmission output is subtracted, and inputting them into the vibration means; and
the vibration means of each reference vibration generator has a function of performing mutual synchronization among the plurality of reference vibration generators by inputting at least a part of outputs from itself and from other reference vibration generators as a received input.

5. A mutual synchronization method for reference vibration generators comprising:
a first step of performing nonlinear limit cycle vibration and transmitting a part of an output to an outside as a transmission output;
a second step of superimposing an amplified outside signal with an output signal by the limit cycle vibration in which the transmission output is subtracted, and inputting superimposed signals as an input signal of the nonlinear limit cycle vibration; and
a third step of inputting at least a part of outputs from a plurality of reference vibration generators arranged distributively as a received input to thereby perform mutual synchronization among the plurality of reference vibration generators.

6. The mutual synchronization method for reference vibration generators, as claimed in claim 5, comprising, amplifying or attenuating the received input and inputting it.

7. The mutual synchronization method for reference vibration generators, as claimed in claim 5, wherein basic frequencies of limit cycle vibration in at least two of the reference vibration generators are different to each other.

8. The mutual synchronization method for reference vibration generators, as claimed in claim 5, comprising, adjusting a period of realizing mutual synchronization among the plurality of reference vibration generators by changing an amplification factor or an attenuation factor for amplifying or attenuating the received input.

9. The mutual synchronization method for reference vibration generators, as claimed in claim 5, wherein amplification factors or attenuation factors for amplifying or attenuating the received input are different to each other.

10. The mutual synchronization method for reference vibration generators, as claimed in claim 5, comprising, performing nonlinear limit cycle vibration of different types to each other as the limit cycle vibration.

11. The mutual synchronization method for reference vibration generators, as claimed in claim 5, wherein the output is an electromagnetic wave, an acoustic wave or an AC electric signal.

12. The mutual synchronization method for reference vibration generators, as claimed in claim 6, wherein basic frequencies of limit cycle vibration in at least two of the reference vibration generators are different to each other.

13. The mutual synchronization method for reference vibration generators, as claimed in claim 6, comprising, adjusting a period of realizing mutual synchronization among the plurality of reference vibration generators by changing an amplification factor or an attenuation factor for amplifying or attenuating the received input.

14. The mutual synchronization method for reference vibration generators, as claimed in claim 6, wherein amplification factors or attenuation factors for amplifying or attenuating the received input are different to each other.

15. The mutual synchronization method for reference vibration generators, as claimed in claim 7, wherein amplification factors or attenuation factors for amplifying or attenuating the received input are different to each other.

16. The mutual synchronization method for reference vibration generators, as claimed in claim 8, wherein amplification factors or attenuation factors for amplifying or attenuating the received input are different to each other.

17. The mutual synchronization method for reference vibration generators, as claimed in claim 6, comprising, performing nonlinear limit cycle vibration of different types to each other as the limit cycle vibration.

18. The mutual synchronization method for reference vibration generators, as claimed in claim 7, comprising, performing nonlinear limit cycle vibration of different types to each other as the limit cycle vibration.

19. The mutual synchronization method for reference vibration generators, as claimed in claim 8, comprising, performing nonlinear limit cycle vibration of different types to each other as the limit cycle vibration.

20. The mutual synchronization method for reference vibration generators, as claimed in claim 9, comprising, performing nonlinear limit cycle vibration of different types to each other as the limit cycle vibration.

21. The mutual synchronization method for reference vibration generators, as claimed in claim 6, wherein the output is an electromagnetic wave, an acoustic wave or an AC electric signal.

22. The mutual synchronization method for reference vibration generators, as claimed in claim 7, wherein the output is an electromagnetic wave, an acoustic wave or an AC electric signal.

23. The mutual synchronization method for reference vibration generators, as claimed in claim 8, wherein the output is an electromagnetic wave, an acoustic wave or an AC electric signal.

24. The mutual synchronization method for reference vibration generators, as claimed in claim 9, wherein the output is an electromagnetic wave, an acoustic wave or an AC electric signal.

25. The mutual synchronization method for reference vibration generators, as claimed in claim 10, wherein the output is an electromagnetic wave, an acoustic wave or an AC electric signal.

* * * * *